(12) United States Patent
Zeng et al.

(10) Patent No.: US 12,166,012 B2
(45) Date of Patent: Dec. 10, 2024

(54) FLIP-CHIP STACKING STRUCTURES AND METHODS FOR FORMING THE SAME

(71) Applicant: Yangtze Memory Technologies Co., Ltd., Hubei (CN)

(72) Inventors: Xinru Zeng, Hubei (CN); Peng Chen, Hubei (CN); Meng Wang, Hubei (CN); Baohua Zhang, Hubei (CN); Houde Zhou, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 194 days.

(21) Appl. No.: 17/243,687

(22) Filed: Apr. 29, 2021

(65) Prior Publication Data

US 2022/0254755 A1    Aug. 11, 2022

Related U.S. Application Data

(63) Continuation of application No. PCT/CN2021/075513, filed on Feb. 5, 2021.

(51) Int. Cl.
*H01L 41/27* (2013.01)
*H01L 21/48* (2006.01)
(Continued)

(52) U.S. Cl.
CPC ...... *H01L 25/0657* (2013.01); *H01L 21/4853* (2013.01); *H01L 21/50* (2013.01);
(Continued)

(58) Field of Classification Search
CPC .................. H10B 41/27; H10B 43/27
See application file for complete search history.

(56) References Cited

U.S. PATENT DOCUMENTS

| 9,984,998 | B2 | 5/2018 | Yu et al. |
| 10,050,019 | B2 | 8/2018 | Kim et al. |

(Continued)

FOREIGN PATENT DOCUMENTS

| CN | 106952831 A | 7/2017 |
| CN | 107546134 A | 1/2018 |

(Continued)

OTHER PUBLICATIONS

International Search Report of the International Searching Authority directed to related International Patent Application No. PCT/CN2021/075513, mailed Nov. 4, 2021; 4 pages.

(Continued)

*Primary Examiner* — Trang Q Tran
(74) *Attorney, Agent, or Firm* — Hanley, Flight & Zimmerman, LLC

(57) ABSTRACT

The present disclosure includes a semiconductor package including a redistribution layer (RDL) having a first surface in contact with input/output (I/O) contacts and a second surface opposite to the first surface. The semiconductor package also includes a staircase interconnect structure formed on the second surface of the RDL and electrically connected with the RDL. The staircase interconnect structure includes staircase layers including a first staircase layer and a second staircase layer stacked on a top surface of the first staircase layer. The second staircase layer covers a portion of the top surface of the first staircase layer such that a remaining portion of the top surface of the first staircase layer is exposed. Integrated circuit (IC) chips are electrically connected to the RDL via the staircase interconnect structure. A first IC chip of the IC chips is electrically connected to the RDL through the remaining portion of the top surface of the first staircase layer.

14 Claims, 16 Drawing Sheets

(51) Int. Cl.
    *H01L 21/50*     (2006.01)
    *H01L 23/00*     (2006.01)
    *H01L 23/538*     (2006.01)
    *H01L 25/065*     (2023.01)
    *H10B 41/27*     (2023.01)
    *H10B 43/27*     (2023.01)
    *H01L 21/60*     (2006.01)

(52) U.S. Cl.
    CPC ...... *H01L 23/5384* (2013.01); *H01L 23/5385* (2013.01); *H01L 23/5386* (2013.01); *H01L 24/14* (2013.01); *H10B 41/27* (2023.02); *H10B 43/27* (2023.02); *H01L 2021/60022* (2013.01); *H01L 2224/02321* (2013.01)

(56) References Cited

U.S. PATENT DOCUMENTS

| | | | |
|---|---|---|---|
| 10,177,119 B2 | 1/2019 | Zhang et al. | |
| 10,559,592 B1 | 2/2020 | Liu et al. | |
| 10,930,617 B2 | 2/2021 | Liu | |
| 11,004,831 B2 | 5/2021 | Lee | |
| 2008/0272476 A1 | 11/2008 | Do et al. | |
| 2010/0258929 A1 | 10/2010 | Kim et al. | |
| 2011/0033980 A1 | 2/2011 | Chung | |
| 2011/0079890 A1 | 4/2011 | Song et al. | |
| 2013/0299977 A1 | 11/2013 | Dayringer et al. | |
| 2016/0020170 A1 | 1/2016 | Ho et al. | |
| 2016/0118326 A1 | 4/2016 | Kwon | |
| 2017/0194292 A1 | 7/2017 | Yu et al. | |
| 2017/0294410 A1 | 10/2017 | Haba et al. | |
| 2018/0204821 A1 | 7/2018 | Guo et al. | |
| 2018/0301374 A1 | 10/2018 | Masamori et al. | |
| 2018/0342481 A1 | 11/2018 | Lee et al. | |
| 2019/0057940 A1 | 2/2019 | Cheah et al. | |
| 2019/0214370 A1 | 7/2019 | Ding et al. | |
| 2020/0051983 A1 | 2/2020 | Zhang et al. | |
| 2020/0194404 A1* | 6/2020 | Chen | H01L 25/0652 |
| 2020/0251447 A1 | 8/2020 | Kang | |
| 2021/0288034 A1* | 9/2021 | Kim | H01L 23/16 |
| 2022/0028440 A1 | 1/2022 | Tang | |

FOREIGN PATENT DOCUMENTS

| | | |
|---|---|---|
| CN | 107611099 A | 1/2018 |
| CN | 108346588 A | 7/2018 |
| CN | 110957284 A | 4/2020 |
| CN | 111883489 A | 11/2020 |
| CN | 112106193 A | 12/2020 |
| JP | 2009-027068 A | 2/2009 |
| KR | 2008-0114030 A | 12/2008 |

OTHER PUBLICATIONS

Chinese Office Action directed to Chinese Patent Application No. 202180000449.6, mailed Apr. 22, 2023; 14 pages.

* cited by examiner

FLIP-CHIP STACKING STRUCTURES AND METHODS FOR FORMING THE SAME

CROSS-REFERENCE TO RELATED APPLICATIONS

This application claims priority to PCT Patent Application No. PCT/CN2021/075513, filed on Feb. 5, 2021, which is incorporated herein by reference in its entirety.

TECHNICAL FIELD

The present disclosure generally relates to the field of semiconductor technology, and more particularly, to a method for multi-chip packaging.

BACKGROUND

Chip packaging is an important facet of modern semiconductor miniaturization. Multiple integrated circuits (ICs) are packed into a single package to accomplish homogeneous or heterogeneous chip integration. For example, memory chips and control logics can be integrated into a single package to achieve lower fabrication cost, reduced device footprint, and improved device performance. To address the density limitation in planar memory cells, three-dimensional (3D) memory architectures are developed. However, as device feature size and package size approach lower limits, creating sufficient number of input/output (I/O) contacts becomes increasingly challenging, especially for planar memory chips or 3D memory chips that address memory bits through an array of word lines and bit lines.

SUMMARY

The present disclosure includes a semiconductor package including a redistribution layer (RDL) having a first surface in contact with input/output (I/O) contacts and a second surface opposite to the first surface. The semiconductor package also includes a staircase interconnect structure formed on the second surface of the RDL and electrically connected with the RDL. The staircase interconnect structure includes staircase layers including a first staircase layer and a second staircase layer stacked on a top surface of the first staircase layer. The second staircase layer covers a portion of the top surface of the first staircase layer such that a remaining portion of the top surface of the first staircase layer is exposed. Integrated circuit (IC) chips are electrically connected to the RDL via the staircase interconnect structure. A first IC chip of the IC chips is electrically connected to the RDL through the remaining portion of the top surface of the first staircase layer.

The present disclosure also includes a method for forming a semiconductor package structure. The method includes providing a carrier substrate and forming a staircase interconnect structure on the carrier substrate. Forming the staircase interconnect structure includes forming a first staircase layer and forming a second staircase layer on a top surface of the first staircase layer. The second staircase layer covers a portion of the top surface of the first staircase layer such that a remaining portion of the top surface of the first staircase layer is exposed. The method also includes flip-mounting integrated circuit (IC) chips over the carrier substrate and on the staircase interconnect structure. Flip-mounting IC chips includes electrically connecting a first IC chip of the IC chips to the first staircase layer through the remaining portion of the top surface of the first staircase layer. The method also includes replacing the carrier substrate with a redistribution layer (RDL). The method further includes electrically connecting the IC chips to the RDL through the staircase interconnect structure by electrically connecting the first IC chip to the RDL through the remaining portion of the top surface of the first staircase layer.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

Illustrative embodiments will now be described with reference to the accompanying drawings. In the drawings, like reference numerals generally indicate identical, functionally similar, and/or structurally similar elements.

DETAILED DESCRIPTION

Figure 1:
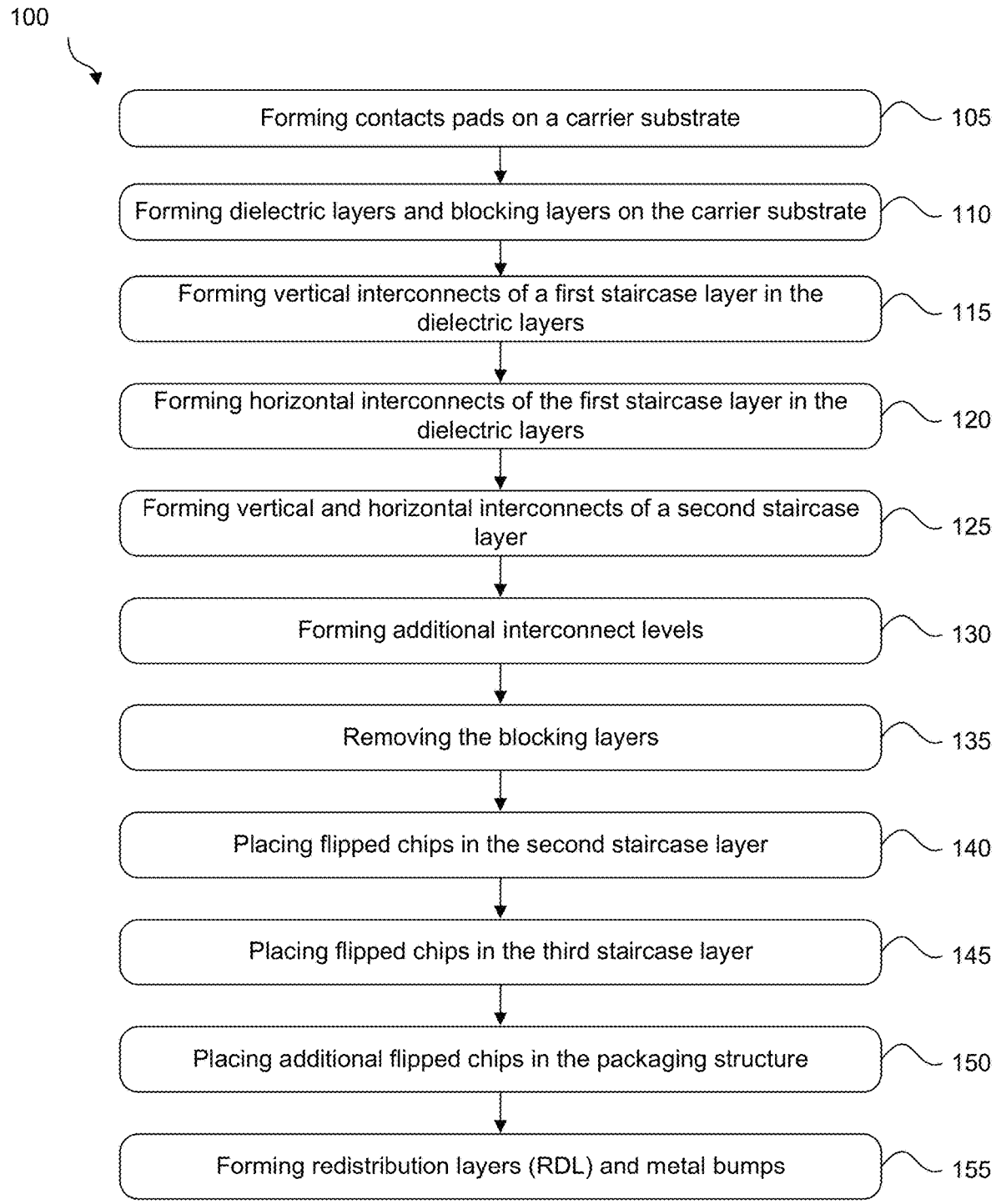
FIG. 1 illustrates an exemplary fabrication process for forming a stacked flip-chip package, in accordance with some embodiments of the present disclosure.

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "bottom," "above," "over," "upper," "top," and the like, may be used herein for ease of description to describe one element or feature's relationship to another element(s) or feature(s) as illustrated in the figures. For example, top and bottom surfaces can respectively refer to first and second major surfaces formed on opposing sides of an element. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate comprises a top surface and a bottom surface. The top surface of the substrate is where a semiconductor device is formed, and therefore the semiconductor device is formed at a top side of the substrate. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D NAND memory device" (referred to herein as "memory device") refers to a semiconductor device with vertically-oriented strings of 3D NAND memory cell transistors (referred to herein as "memory strings," such as NAND strings or 3D NAND strings) on a laterally-oriented substrate so that the memory strings extend in the vertical direction with respect to the substrate. As used herein, the term "vertical/vertically" means nominally perpendicular to the lateral surface of a substrate.

As used herein, the term "disposed" refers to being formed or otherwise created or located by methods such as depositing, attaching, or placing, for example.

In the present disclosure, the term "horizontal/horizontally" means nominally parallel to the lateral surface of a substrate.

Integrated circuit packaging is often the final stage of semiconductor device fabrication. Multiple integrated circuits (e.g., chips) are packed into a single package to accomplish homogeneous or heterogeneous chip integration. The packaging provides protection for the contents enclosed in the package and enables access for power and signals to and from the external circuitry. Fan-out packaging technologies such as Fan-Out Wafer Level Packaging (FOWLP) and Fan-Out Panel Level Packaging (FOPLP) are developed to achieve lower fabrication cost, reduced device footprint, and improved device performance. In an FOWLP process, individual chips are disposed on a wafer-shaped substrate with spaces allocated between each die for additional input/output (I/O) connection points. The chips are then embedded in a mold compound. Redistribution layers (RDL) are formed to re-route I/O connections on the chips from the mold compound regions in the periphery. A dicing saw can separate chips from an array of completed packages formed on the wafer-shaped substrate to form individual semiconductor packages. However, since a regular large-size wafer is about 300 mm, the amount of semiconductor devices that can be manufactured and packaged on a wafer is limited. FOPLP process is developed to provide increased packaging capability compared to FOWLP processes. In an FOPLP process, chips are disposed on a substrate level panel rather than a wafer-shaped substrate to increase the packaging capability. For example, the substrate level panel can be a square-shaped panel with a side that is 500 mm or 600 mm in length.

For both FOWLP and FOPLP processes, it is becoming increasingly challenging to support the amount of I/O connections for stacked memory devices, such as 3D NAND memory chips. As the demand for higher storage capacity continues to increase, the number of vertical levels of the memory cells and staircase structures also increases. For example, a 64-level 3D NAND memory device can include two 32-level staircase structures with one formed on top of the other. Similarly, a 128-level 3D NAND memory device can include two 64-level staircase structures. As device critical dimensions continue to shrink, it is increasingly more challenging to provide sufficient amount of I/O connections for memory chips in fan-out packaging.

Various embodiments described in the present disclosure incorporate stacked staircase interconnect structures for memory chips in fan-out packaging. Stacked staircase interconnect structures can provide electrical connections to each IC chip of the stacked IC chips through pillar bumps formed on each level of the stacked staircase interconnect structure, which in turn increases the number of I/O connection points. The embodiments described herein use fan-out packaging as examples and can be applied to other packaging technologies.

FIG. 1 is a flow diagram of a method 100 for fabricating a multi-chip packaging incorporating staircase interconnect structures, according to some embodiments. For illustrative purposes, the operations illustrated in FIG. 1 will be described with reference to the example fabrication process of fabricating packaging structure 200 as illustrated in FIGS. 2-12 and packaging structure 1300 in FIGS. 13 and 14. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Referring to FIG. 1, in operation 105, contact pads are formed on a carrier substrate, according to some embodiments. For example, contact pads 208 are formed on carrier substrate 202 as described with reference to packaging structure 200 illustrated in FIG. 2. For clarity of illustration, FIG. 2 includes various views of packaging structure 200. For example, FIG. 2 includes a side view 200 and a corresponding plan view 220 illustrating contact pads 208 and substrate 202. Contact pads 208 can be disposed in a first package 204 and a second package 206 of packaging structure 200. First and second packages 204 and 206 can be separated at package boundary 205. Additional IC chips can be disposed on packaging structure 200 and are not illustrated in FIG. 2 for simplicity. In some embodiments, the IC chips included in first and second packages 204 and 206 can be the same or different, depending on device design and desired function.

Carrier substrate 202 can include any suitable material for semiconductor packaging. For example, substrate carrier can include glass, gallium nitride, gallium arsenide, III-V compound, glass, plastic sheet, silicon, silicon germanium, silicon carbide, silicon on insulator (SOI), germanium on insulator (GOI), any other suitable materials, and/or combinations thereof.

Figure 2:
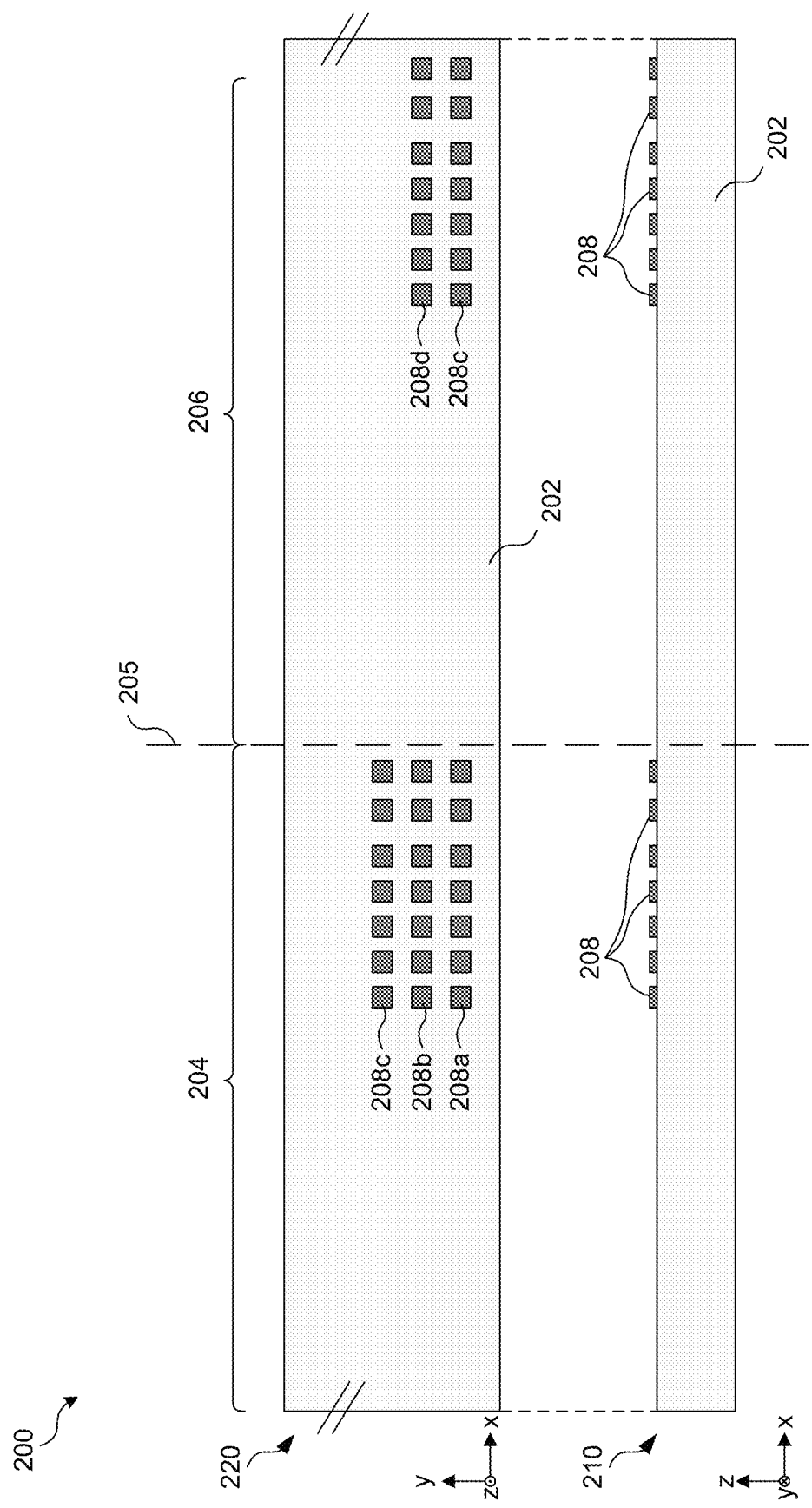
FIGS. 2-12 illustrate cross-sectional views of a stacked flip-chip package incorporating staircase interconnect structures formed on one end of the stacked chips, in accordance with some embodiments of the present disclosure.

Contact pads 208 can be formed using a conductive material and formed on a top surface of carrier substrate 202. Contact pads 208 can be used for subsequently forming I/O connections. In some embodiments, one or more rows of contact pads 208 can be formed. As an example, first package 204 includes at least three rows of contact pads 208a, 208b, and 208c whereas second package 206 includes at least two rows of contact pads 208c and 208d, as shown in a plan view 200 in FIG. 2. In some embodiments, contact pads 208 can be embedded in carrier substrate 202, where top surfaces of contacts pads 208 and the top surface of carrier substrate 202 are substantially coplanar. In some embodiments, contact pads 208 can be formed of tungsten (W), cobalt (Co), copper (Cu), aluminum (Al), silver (Ag), gold (Au), doped silicon, silicides, titanium nitride (TiN), tantalum nitride (TaN), any suitable materials, and/or combinations thereof. In some embodiments, contact pads 208 can be disposed by a blanket deposition process followed by a patterning process. In some embodiments, contact pads 208 can be disposed from a peripheral region extending towards a center of first and second packages 204 and 206, as shown in FIG. 2. In some embodiments, not shown in FIG. 2, contact pads 208 can be formed in a central region of first and second packages 204 and 206. In some embodiments, contact pads 208 can be formed in a peripheral region of first package 204 and formed in a central region of second package 206. In some embodiments, contact pads 208 can be disposed using deposition techniques including, but not limiting to, chemical vapor deposition (CVD), flowable CVD (FCVD), sputtering, metal-organic CVD (MOCVD), plasma-enhanced CVD (PECVD), low pressure CVD (LPCVD), physical vapor deposition (PVD), high-density plasma (HDP), any suitable deposition techniques, and/or combinations thereof.

Figure 3:
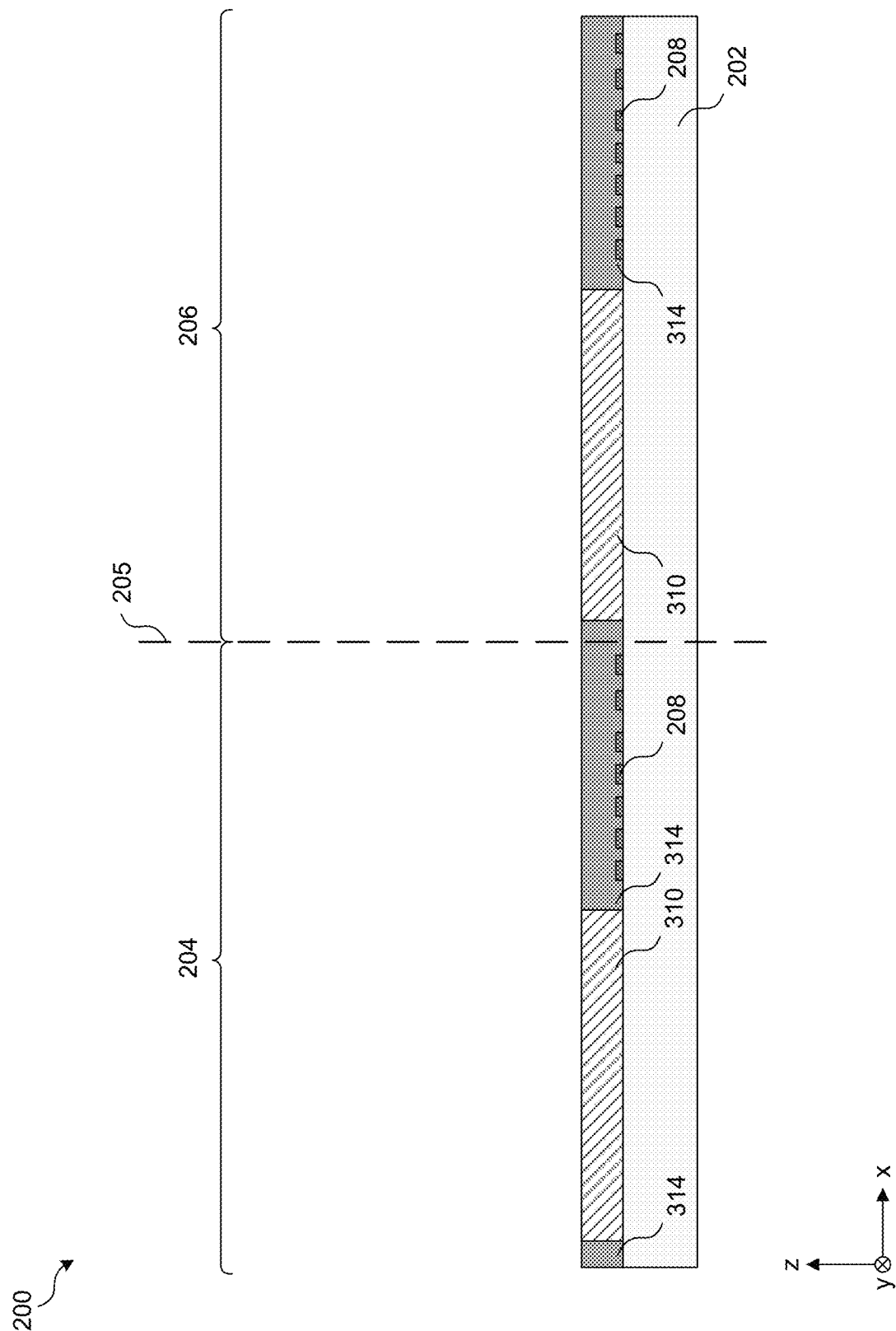

Referring again to FIG. 1, in operation 110, dielectric layers and blocking layers are formed on the carrier substrate, according to some embodiments. For example, as shown in FIG. 3, dielectric layers 310 and blocking layers 314 can be formed on carrier substrate 202 in first package 204 and second package 206 of packaging structure 200.

Dielectric layers 310 can be disposed by blanket depositing a dielectric material on carrier substrate 202, including on the top surface of carrier substrate 202 and on exposed surfaces of contact pads 208. A patterning process can be used to remove portions of the blanket-deposited dielectric material such that the remaining portions of the dielectric material can form dielectric layers 310. In some embodiments, dielectric layers 310 can be formed of an insulating material, such as silicon oxide, silicon nitride, silicon oxynitride, silicon carbide, silicon oxycarbide, any suitable insulating material, and/or combinations thereof. In some embodiments, disposing dielectric layers 310 can include any suitable deposition techniques, including, but not limiting to, CVD, FCVD, sputtering, MOCVD, PECVD, LPCVD, PVD, HDP, any suitable deposition techniques, and/or combinations thereof.

Blocking layers 314 can be disposed between dielectric layers 310 and on top surfaces of carrier substrate 202 and contact pads 208. In some embodiments, blocking layers 314 can be disposed by blanket depositing a dielectric material on dielectric layers 310, top surfaces of carrier substrate 202, and exposed surfaces (e.g., top surfaces and sidewalls) of contact pads 208. A patterning process or a polishing process can be performed such that the deposited material remains between adjacent dielectric layers 310 and that top surfaces of blocking layers 314 and dielectric layers 310 are substantially planar. For example, a chemical mechanical polishing (CMP) process can be used. In some embodiments, blocking layers 314 and dielectric layers 310 are formed of different materials. For example, blocking layers 314 and dielectric layers 310 can be disposed using materials that have high etching selectivity (e.g., greater than about 10) against each other. For example, blocking layers 314 can be formed using silicon oxide and dielectric layers 310 can be formed using silicon oxynitride. In some embodiments, blocking layers 314 can be formed of an insulating material, such as silicon oxide, silicon nitride, silicon oxynitride, silicon carbide, silicon oxycarbide, any suitable insulating material, and/or combinations thereof. In some embodiments, the deposition process of blocking layers 314 can include any suitable deposition techniques, including, but not limiting to, CVD, FCVD, sputtering, MOCVD, PECVD, LPCVD, PVD, HDP, any suitable deposition techniques, and/or combinations thereof. In some embodiments, blocking layer 314 can be formed of a photoresist material and deposited by a spin-on process. In some embodiments, an anneal process can be applied to the deposited photoresist material to enhance its physical durability.

Figure 4:
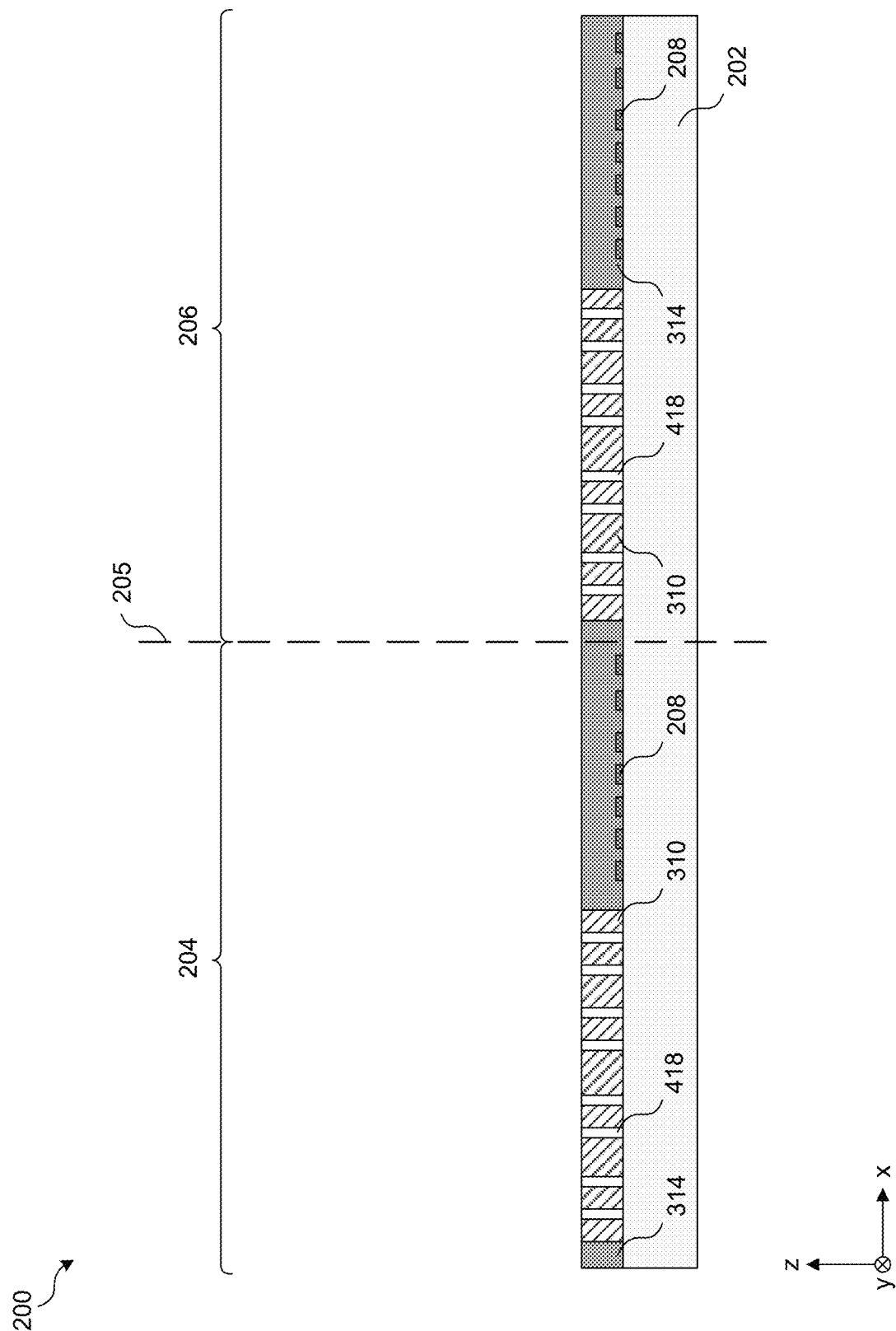

Referring again to FIG. 1, in operation 115, vertical interconnects of a first staircase layer are formed in the dielectric layers, according to some embodiments. For example, as shown in FIG. 4, vertical interconnects 418 can be disposed in dielectric layers 310 in first package 204 and second package 206 of packaging structure 200.

Vertical interconnects 418 can be conductive lines disposed by etching openings in dielectric layers 310 and depositing a conductive material in the openings. In some embodiments, vertical interconnects 418 can be disposed by a damascene or a dual damascene process. In some embodiments, vertical interconnects 418 can be formed of conductive materials, such as copper, cobalt, tungsten, aluminum, gold, silver, any suitable conductive materials, and combinations thereof. In some embodiments, the conductive material can be blanket deposited until openings are filled. A planarization process (e.g., a CMP process) can be used such that top surfaces of the remaining conductive material and dielectric layer 310 are substantially coplanar.

Figure 5:
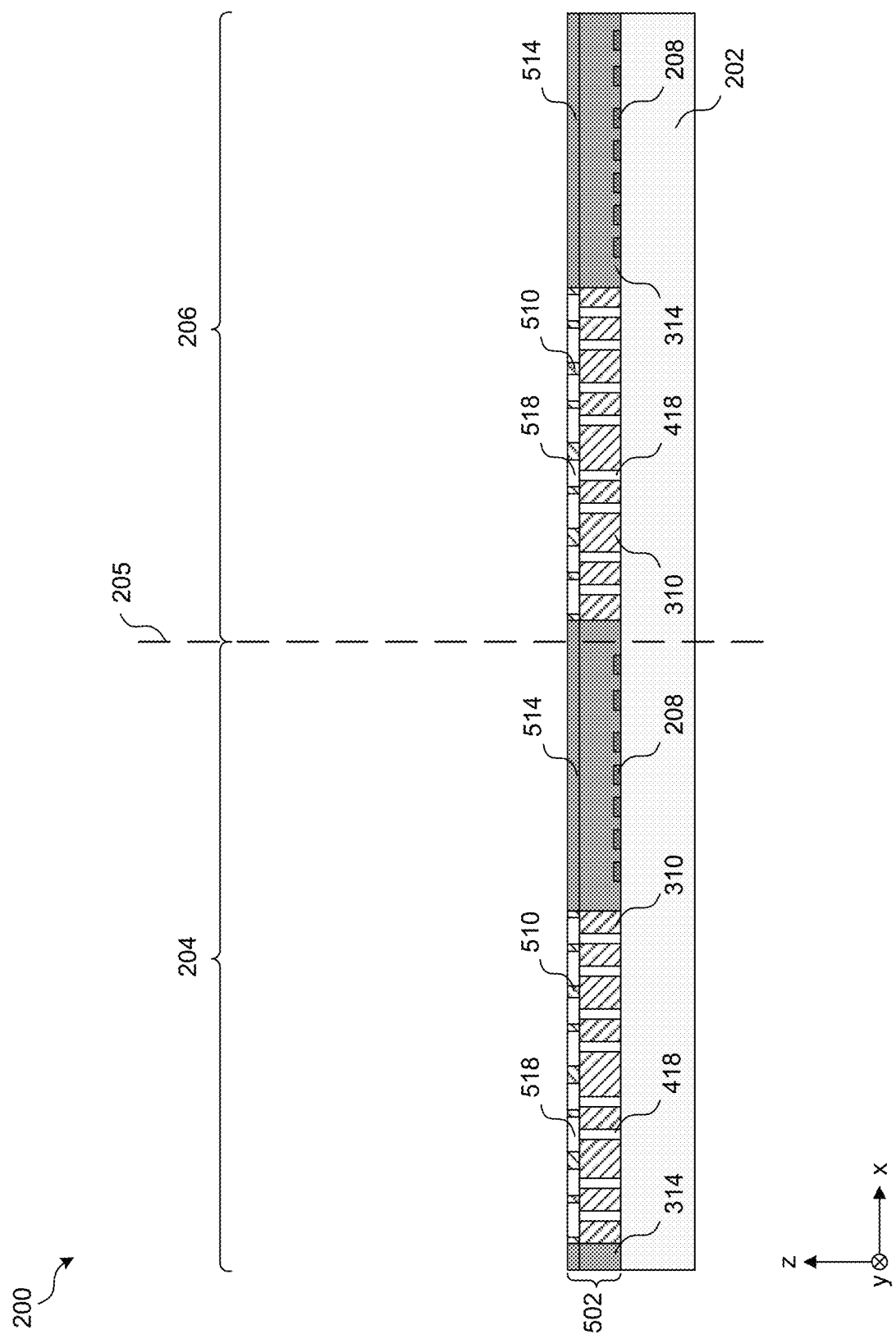

Referring again to FIG. 1, in operation 120, horizontal interconnects for the first staircase layer are formed in the dielectric layers, according to some embodiments. For example, as shown in FIG. 5, horizontal interconnects 518 can be disposed in dielectric layers 514 in first package 204 and second package 206 of packaging structure 200. Horizontal and vertical interconnects 418 and 518 can form the lowest interconnect level of the staircase interconnect structure. A staircase interconnect structure can be formed from a plurality of interconnect levels, where each interconnect level is also referred to as a "staircase layer" (or "SC layer") of the staircase interconnect structure in the present disclosure. For example, first staircase layer 502 can be formed including vertical interconnects 418 and horizontal interconnects 518, according to some embodiments.

Dielectric layer 510 and blocking layer 514 can be disposed on dielectric layer 310 and blocking layer 314, respectively. In some embodiments, dielectric layer 510 can be disposed using similar deposition methods and material composition as those of dielectric layer 310. For example, dielectric layers 310 and 510 can be formed of silicon oxide, silicon nitride, or silicon oxynitride. Similarly, blocking layer 514 can be disposed using similar deposition methods and material composition as those of blocking layer 314. For example, blocking layers 314 and 514 can be formed of a photoresist material.

Horizontal interconnects 518 can be conductive lines disposed by etching openings in dielectric layers 510 and depositing a conductive material in the openings. In some embodiments, horizontal interconnects 518 can be disposed by a damascene or a dual damascene process. In some embodiments, horizontal interconnects 518 and vertical interconnects 418 can be formed using similar conductive materials, such as copper, cobalt, tungsten, aluminum, gold, and silver. In some embodiments, a width of horizontal interconnects 518 can be greater than a width of vertical interconnects 418 for providing electrical connection in the horizontal direction and also providing greater alignment tolerance for electrically connecting subsequent interconnect structures with vertical interconnects 418. In some embodiments, a planarization process can be used such that top surfaces of horizontal interconnects 518, dielectric layer 510, and blocking layer 514 are substantially coplanar.

Figure 6:
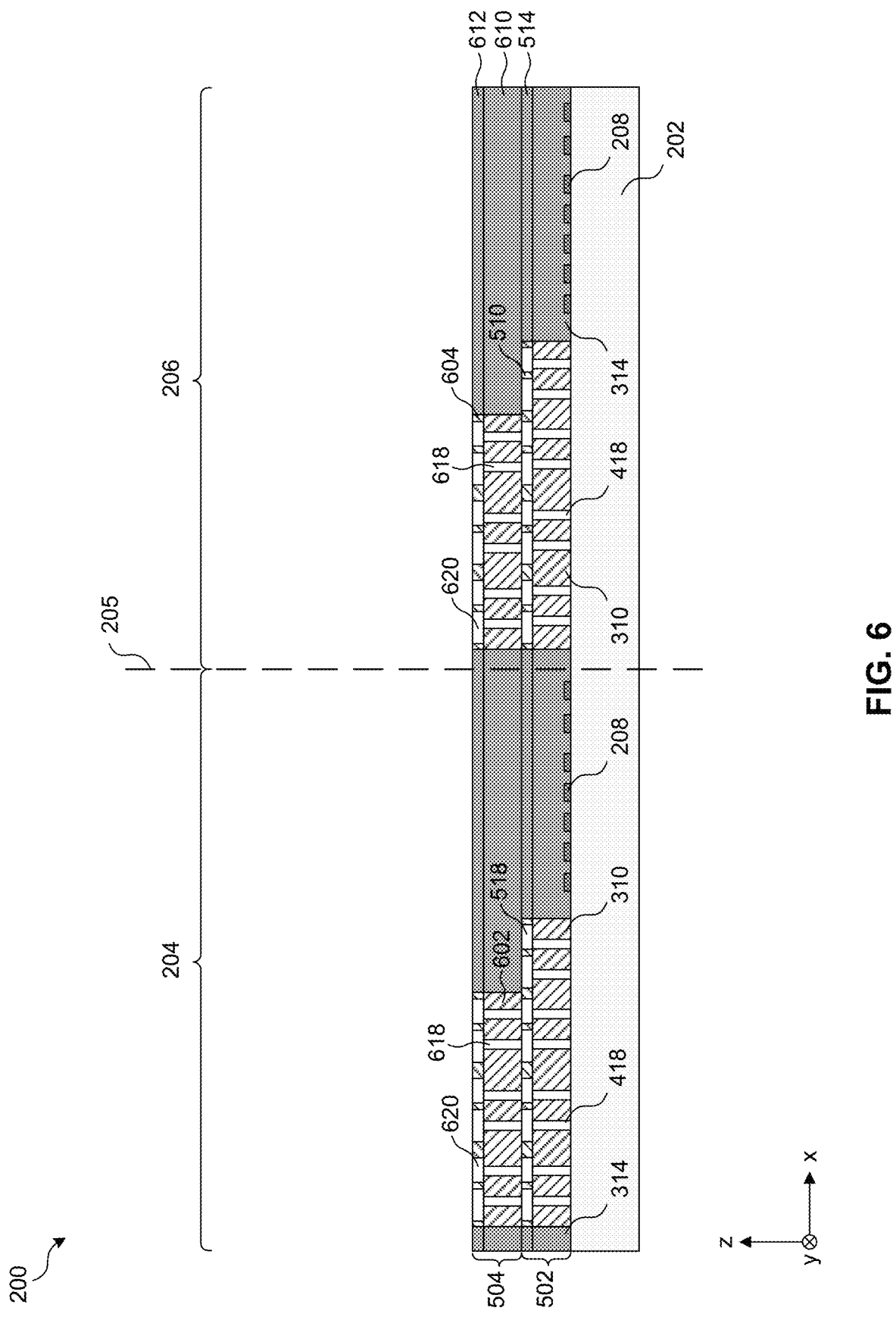

Referring again to FIG. 1, in operation 125, vertical and horizontal interconnects for a second staircase layer are formed in the dielectric layers, according to some embodiments. For example, as shown in FIG. 6, second staircase layer 504 is formed on first staircase layer 502. A width of second staircase layer 504 is less than a width of first staircase layer 502 such that one or more interconnect structures from first staircase layer 502 are exposed and subsequently covered by blocking layers 610 and 612. In some embodiments, material composition and deposition methods for dielectric layers 602 and 604 can be similar to those of dielectric layers 310 and 510, respectively. In some embodiments, material composition and deposition methods of blocking layers 610 and 612 can be similar to those of blocking layers 314 and 514, respectively. Vertical interconnects 618 and horizontal interconnects 620 can be disposed in dielectric layers 602 and 604, respectively.

Figure 7:
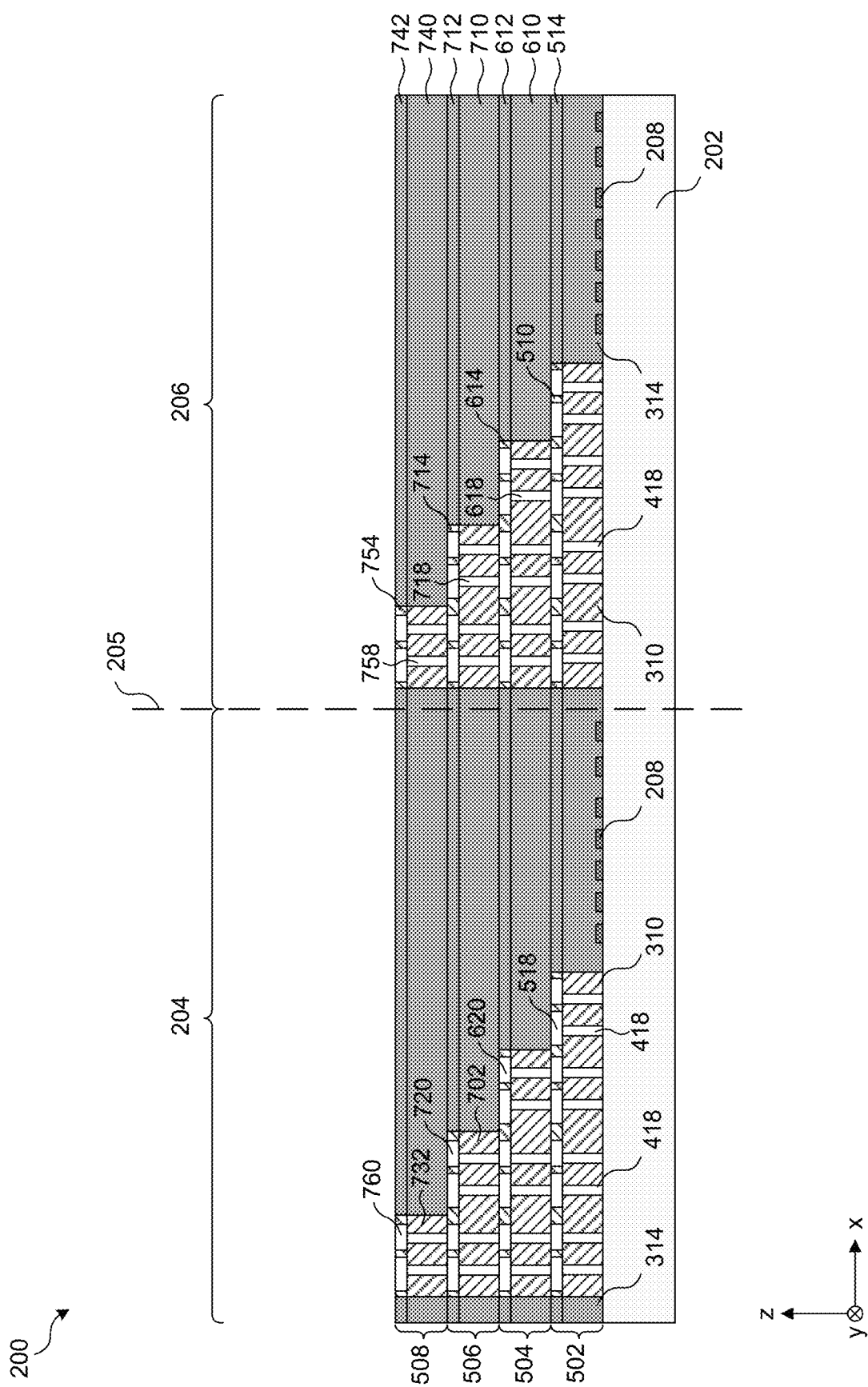

Referring again to FIG. 1, in operation 130, additional staircase layers are formed, according to some embodiments. As shown in FIG. 7, additional staircase layers such as third and fourth staircase layers 506 and 508 are subsequently formed on second staircase layer 504. Third staircase layer 506 can include vertical interconnects 718 and horizontal interconnects 720 formed in dielectric layers 702 and 714, respectively. Similarly, fourth staircase layer 508 can include vertical and horizontal interconnects 758 and 760 formed in dielectric layers 732 and 754, respectively. Blocking layers 710, 712, 740, and 742 can be similar to blocking layers 314 and 514 and are not described in details herein for simplicity. Each of the subsequent staircase layer has a width less than the preceding staircase layer underneath, such that the at least one or more interconnects from the staircase layer underneath are exposed and subsequently covered by a blocking layer. For example, blocking layer 710 is in contact with horizontal interconnects 620 of second staircase layer 504. Similarly, blocking layer 740 from fourth staircase layer 508 are in contact with horizontal interconnect 720 of third staircase layer 504.

Figure 8:
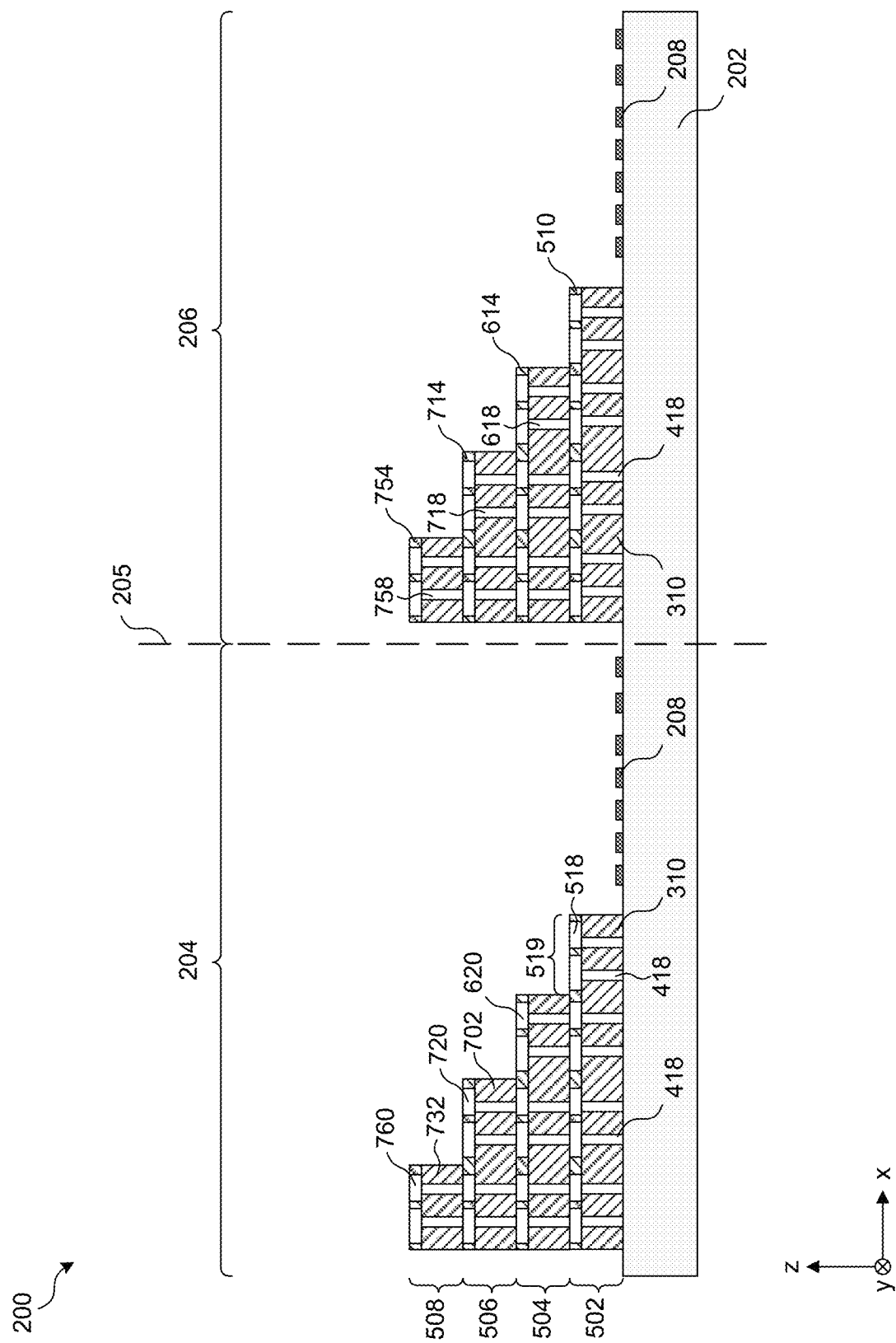

Referring again to FIG. 1, in operation 135, blocking layers are removed, according to some embodiments. As shown in FIG. 8, blocking layers from all staircase layers are removed to expose the dielectric layers and the horizontal interconnects that other not covered by subsequent staircase layers. Specifically, blocking layers such as blocking layers 314, 514, 610, 612, 710, 712, 740, and 742 can be removed to expose horizontal interconnects formed proximate to the end of each staircase layer. In some embodiments, not all blocking layers are removed. The exposed horizontal interconnects and portions of the dielectric layers can be collectively referred to as a "step" or "stair" of the staircase interconnect structure. For example, top surfaces of portions of first staircase layer 502 that is exposed by removing blocking layers can be referred to as step 519, as shown in FIG. 8. Therefore, adjacent staircase layers are offset by the steps formed at ends of the staircase layers. Specifically, a pair of offset adjacent staircase layers can include a first staircase layer and a subsequently formed second staircase layer covering a portion of, but not the entirety of, a top surface of the first staircase layer. For example, step 519 of first staircase layer 502 is exposed and not covered by dielectric layer 602 of second staircase layer 504. In some embodiments, blocking layers can be removed using suitable etching processes, such as a plasma etching process or a wet etching process. In some embodiments, the blocking layers are formed using a photoresist material and the removing process can include a photoresist stripping or a plasma ashing process.

Figure 9:
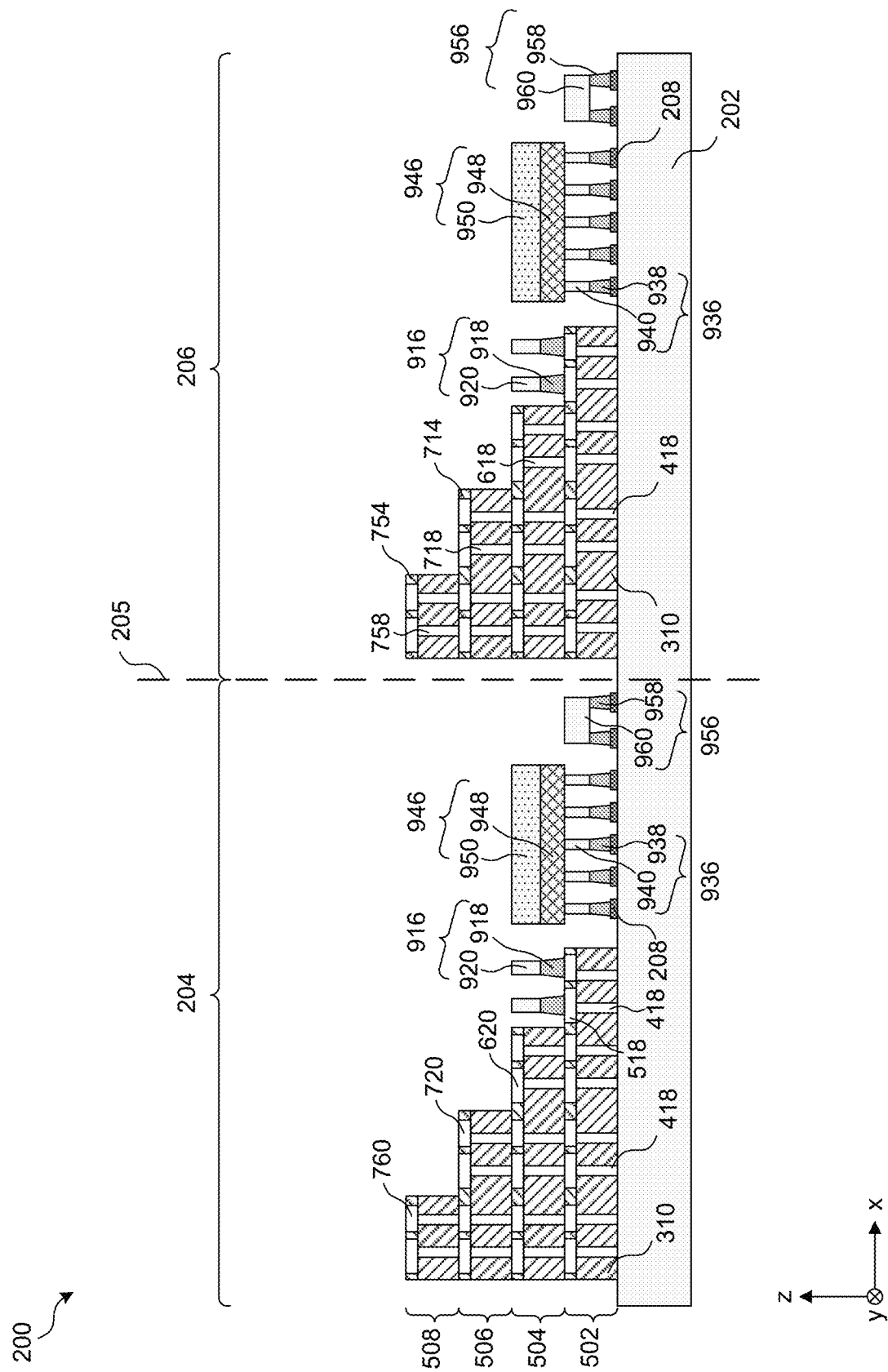

Referring again to FIG. 1, in operation 140, flipped chips are disposed in second staircase layer 504, according to some embodiments. As shown in FIG. 9, pillar bumps 916, 936, and 956 can be disposed in packaging structure 200. Pillar bumps 916 can be disposed at a same horizontal level as second staircase layer 504. As such, pillar bumps 916 are above first staircase layer 502 and electrically coupled to horizontal interconnects 518 of first staircase layer 502. Pillar bumps 916 can include pillar base 918 and pillar body 920. In some embodiments, pillar base 918 and pillar body 920 can be formed using a similar conductive material. For example, pillar base 918 and pillar body 920 can be formed using copper. In some embodiments, pillar base 918 and pillar body 920 can be formed using electroplating, electroless plating, sputtering, PVD, any suitable deposition process, and combinations thereof. In some embodiments, pillar base 918 and pillar body 920 can be formed using different conductive materials. In some embodiments, pillar base 918 and pillar body 920 can be formed using any suitable conductive material, such as tungsten, cobalt, silver, gold, and combinations thereof. Pillar bumps 936 can include pillar base 938 in contact with contact pads 208 and a pillar body 940 formed on pillar base 938. In some embodiments, pillar base 938 and pillar body 940 can be formed using materials and deposition processes that are similar to those of pillar base 918 and pillar body 920 and are not described in detail herein for simplicity. Pillar bumps 936 can be used to provide electrical connections to flipped chips that are disposed in a horizontal level the same as second staircase layer 504. In some embodiments, second staircase layer 504 can be a lowest chip placement level directly connected to contact pads 208. Pillar bumps 956 can include pillar base 958 in contact with contact pads 208 and a pillar body 960 formed on pillar base 958. In some embodiments, pillar base 958 and pillar body 960 can be formed using materials and deposition processes that are similar to those of pillar base 918 and pillar body 920 and are not described in detail herein for simplicity. In some embodiments, a single pillar body 960 can be physically and electrically connected to two or more pillar bases 958. Pillar body 960 can be connected to terminals of chips that are disposed in packaging structure 200 but are not illustrated in FIG. 9.

Chips 946 can be flip-mounted on contact pads 208 via pillar bumps 936. In some embodiments, chips 96 are mounted at a horizontal level that is level with second staircase layer 504. Chips 946 can include integrated circuits 948 attached to carrier 950. Chips 946 can be flipped over and mounted on pillar bumps 936 such that terminals (not illustrated in FIG. 9) from integrated circuits 948 can be in contact with top surfaces of pillar bodies 940. This mounting configuration can enable power and signals to be transmitted between pillar bumps 936 and chips 946 such that integrated circuits 948 can be controlled by external circuitry. In some embodiments, chips 946 can include various suitable integrated circuits, such as control circuitry including transistors arranged to be CMOS circuits, RF circuitry, and the like. In some embodiments, active and passive devices—such as transistors, diodes, capacitors, resistors, inductors, and the like—can be disposed on and/or within chips 946. The incorporation of pillar bumps such as pillar bumps 916, 936, and 956 can reduce the need of wire bonding connections, which in turn reduces parasitic capacitance and inductance. Although FIG. 9 illustrates one row of pillar bumps 916, 936, and 956, multiple rows/columns of pillar bumps can be disposed to provide electrical connections. For example, pillar bumps 916, 936, and 956 are formed in a row extending in the x-direction. Additional pillar bumps can be disposed in columns that extend in the y-direction and are not illustrated in FIG. 9 for simplicity. For example, pillar bumps can be formed on multiple rows of contact pads 208a-208d illustrated with reference to plan view 200 of FIG. 2. Incorporating arrays of pillar bumps in packaging structures can improve product yield and performance as well as increasing the number of available I/O connects, which in turn can alleviate the need of using wire connections (e.g., wire bonding) to form high-yield multiple rows/columns of I/O connects.

Figure 10:
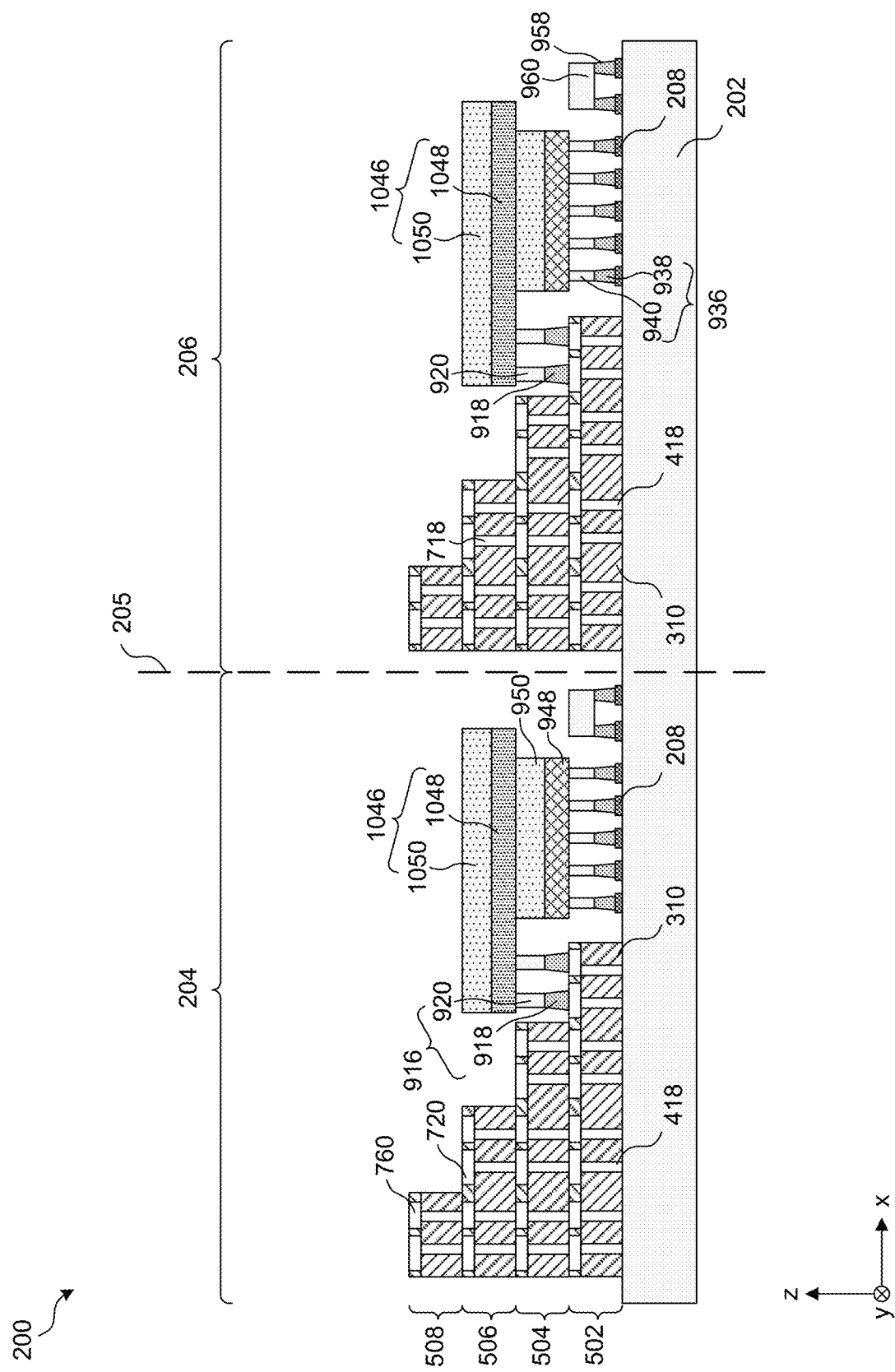

Referring again to FIG. 1, in operation 145, flipped chips are disposed in the third staircase layer, according to some embodiments. As shown in FIG. 10, chips 1046 can include integrated circuits 1048 attached to carrier 1050. Chips 1046 disposed in a horizontal level that is the same as third staircase layer 506 are directly connected to a lower staircase layer (e.g., second staircase layer 504). Chips 1046 can be flipped over and mounted on pillar bumps 916 such that terminals (not illustrated in FIG. 9) from integrated circuits 1048 face toward step 519 and can be in contact with top surfaces of pillar bodies 920. This mounting configuration can enable power and signals to be transmitted between pillar bumps 916 and chips 1046 such that integrated circuits 1048 can be controlled by external circuitry through horizontal and vertical interconnects of first staircase layer 502.

Chips 1046 can include various integrated circuits, such as memory circuitry. For example, chips 1046 can include three-dimensional (3D) memory circuitry such as 3D NAND flash memory chips. 3D NAND flash memory chips can include arrays of flash memory cells that include a stack of gate electrodes arranged over a substrate, with semiconductor channels through and intersecting word lines, into the substrate. Detailed structures of 3D NAND flash memory chips are not illustrated in FIG. 10 for simplicity. Detailed structure can include bottom/lower gate electrodes that function as bottom/lower selective gates. The top/upper gate electrodes function as top/upper selective gates. The word lines/gate electrodes between the top/upper selective gate electrodes and the bottom/lower gate electrodes function as word lines. The intersection of a word line and a semiconductor channel forms a memory cell. The top/upper selective gates are connected to word lines for row selection, and the bottom/lower selective gates are connected to bit lines for column selection. The 3D NAND memory chips can include arrays of contact structures for providing electrical connections from external connections to the word lines, selective gates, or any suitable terminals. The contact structures can be electrically coupled to external connections of the semiconductor packaging to be accessed by flash memory controllers or systems. Examples of 3D NAND flash memory devices and methods for forming the same can be found in U.S. Pat. No. 10,559,592, titled "Memory Device and Forming Method Thereof," which is hereby incorporated by reference in its entirety.

Figure 11:
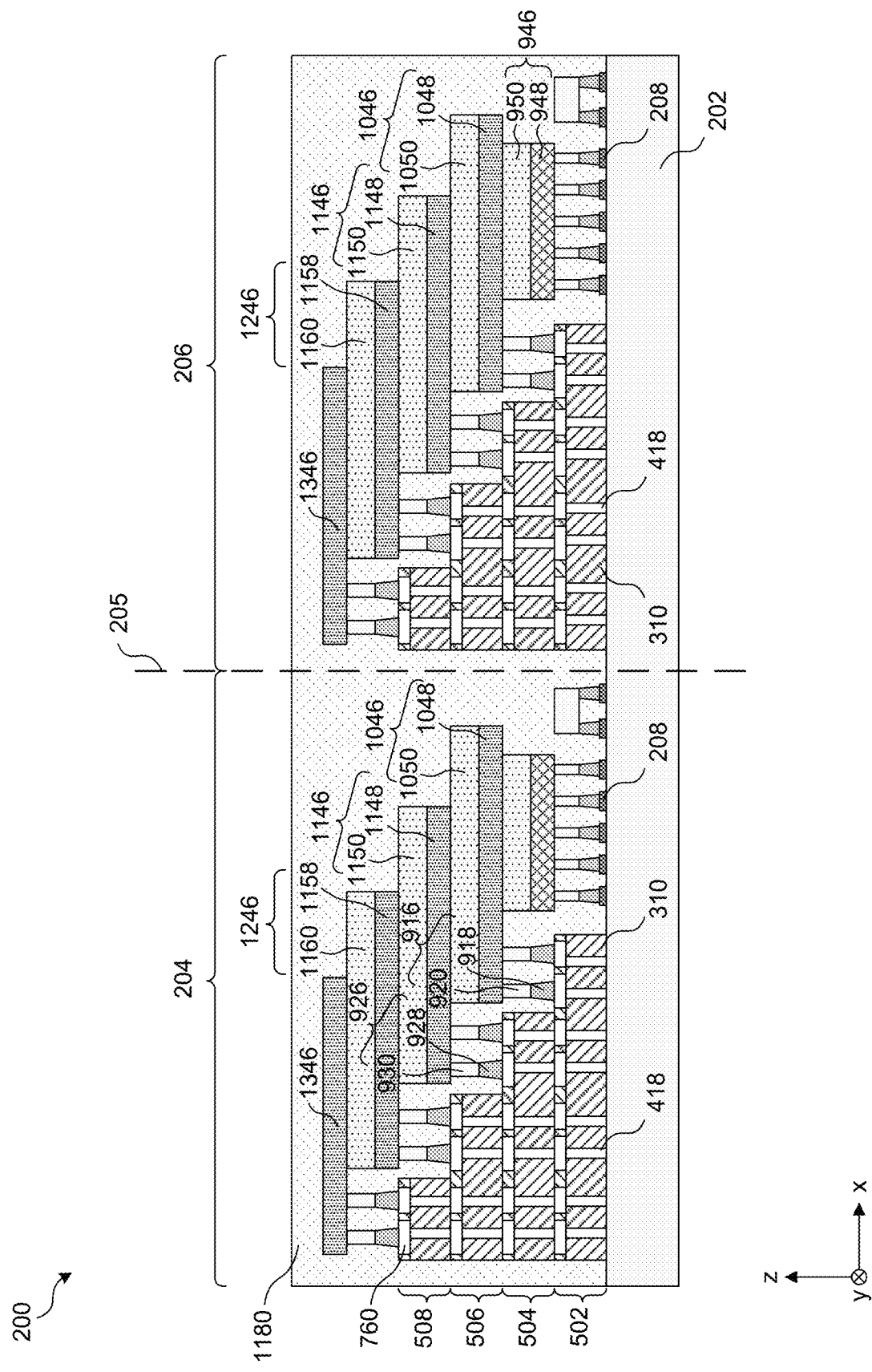

Referring again to FIG. 1, in operation 150, additional flipped chips are disposed in various staircase layers, according to some embodiments. The flipped chips can include integrated circuits mounted on a carrier. For example, chip 1146 can include integrated circuits 1048 attached to carrier 1050. In some embodiments, chips can be disposed without a carrier, such as chip 1346 that includes integrated circuits. As shown in FIG. 11, similar to chip 1046, each of chips 1146, 1246, and 1168 can be subsequently disposed on a staircase layer and directly and electrically connected to another staircase layer immediately under the staircase layer. Chips 1146, 1246, and 1168 can also be electrically connected to other staircase layers through horizontal and vertical interconnects. For example, chips 1146 can be flipped over and mounted on pillar bumps 926 such that terminals (not illustrated in FIG. 11) from integrated circuits 1148 can face (e.g., directly above) a portion of second staircase layer 504 that is not covered by third staircase layer 506 and be in contact with top surfaces of pillar bodies 930. This mounting configuration can enable power and signals to be transmitted between pillar bumps 926 and chips 1146 such that integrated circuits 1148 can be controlled by external circuitry through horizontal and vertical interconnects of first and second staircase layers 502 and 504.

A molding compound can be formed on carrier substrate and encapsulating the stacked interconnect structures and the disposed chips. As shown in FIG. 11, molding compound 1180 can be disposed such that staircase layers 502-508 and chips 946-1346 are embedded within molding compound 1180. In some embodiments, molding compound 1180 can be formed of a resin compound, an epoxy molding compound, any suitable molding compounds, and/or combinations thereof.

Figure 12:
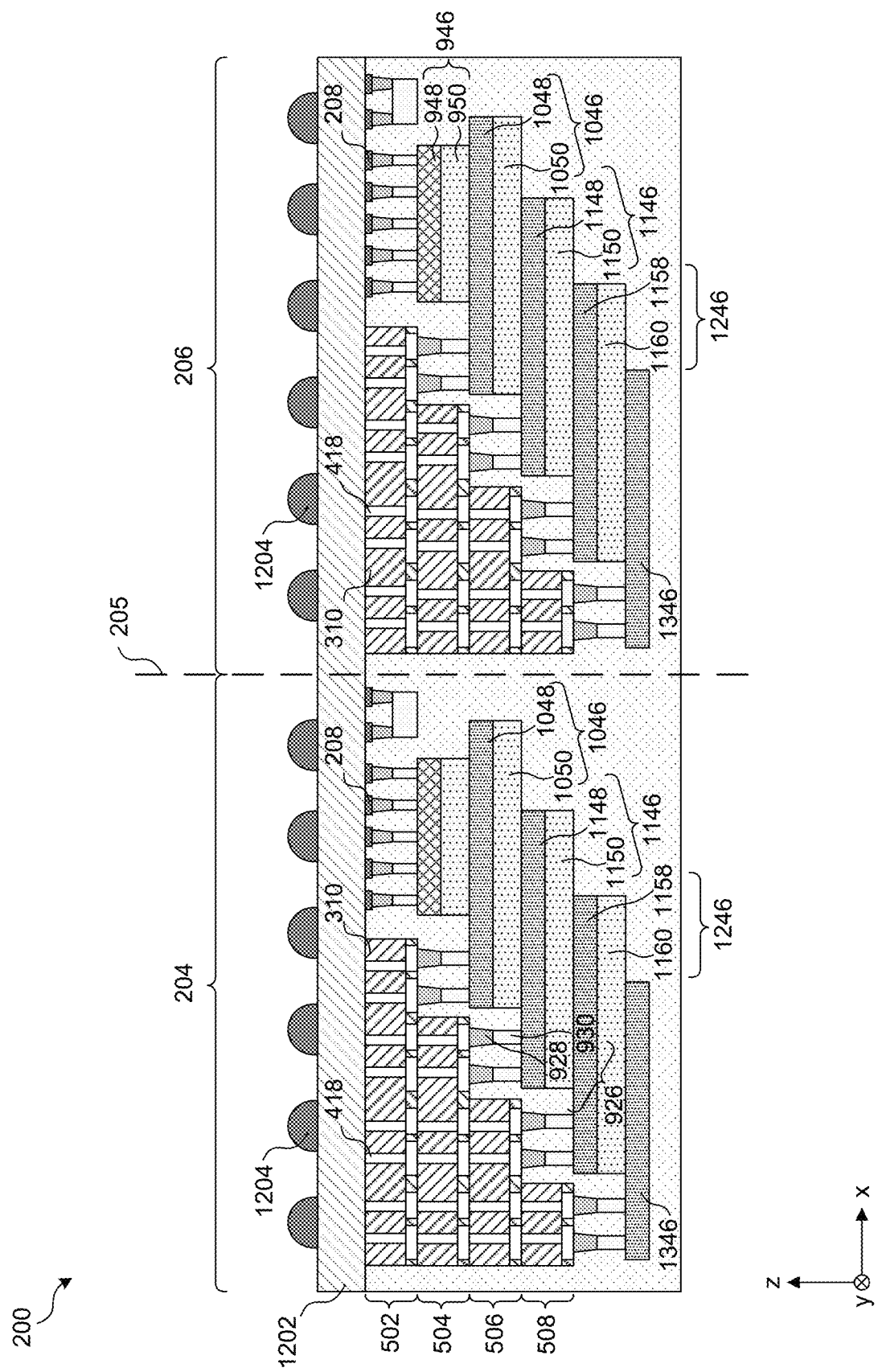

Referring again to FIG. 1, in operation 155, redistribution layer (RDL) and metal bumps are formed, according to some embodiments. As shown in FIG. 12, packaging structure 200 is flipped over and RDL 1202 and metal bumps 1204 can be disposed on a backside of packaging structure 200. Metal bumps 1204 can be used as I/O contacts or as any suitable electrical contacts. In some embodiments, carrier substrate 202 can be replaced by RDL 1202. For example, carrier substrate 202 can be removed to expose surfaces of dielectric layer 310, vertical interconnects 418, contact pads 208, and molding compound 1180. RDL 1202 can then be formed on the aforementioned exposed surfaces. RDL 1202 can include horizontal and vertical conductive lines for fanning-out vertical interconnections formed in first staircase layer 502 to a larger footprint. In some embodiments, RDL 1202 can include one or more dielectric layers with conductive wires (not illustrated in FIG. 12 for simplicity) embedded therein. The conductive wires can be formed using any suitable material, such as aluminum, aluminum alloy, or other metals. In some embodiments, RDL 1202 can further include fuses.

Metal bumps 1204 can be disposed on and electrically connected to RDL 1202. Metal bump 1204 can include solder bumps, such as eutectic solder bumps. Alternatively, metal bumps 1204 can be formed of copper bumps or other metal bumps formed of gold, silver, nickel, tungsten, aluminum, other metals, and/or alloys thereof. Metal bumps 1204 can also include Controlled Collapse Chip Connection (C4) bumps used in semiconductor interconnection techniques, such as flip chip interconnections. In some embodiments, Metal bumps 1204 can protrude from the surface of RDL 1202, as shown in FIG. 12. A solder mask (not shown) can be disposed before the formation of metal bumps 1204 to protect the bump material from forming in undesired regions. Metal bumps 1204 can be formed through any number of suitable techniques, including PVD, CVD, electrochemical deposition (ECD), molecular beam epitaxy (MBE), atomic layer deposition (ALD), electroplating, and the like.

Figure 13:
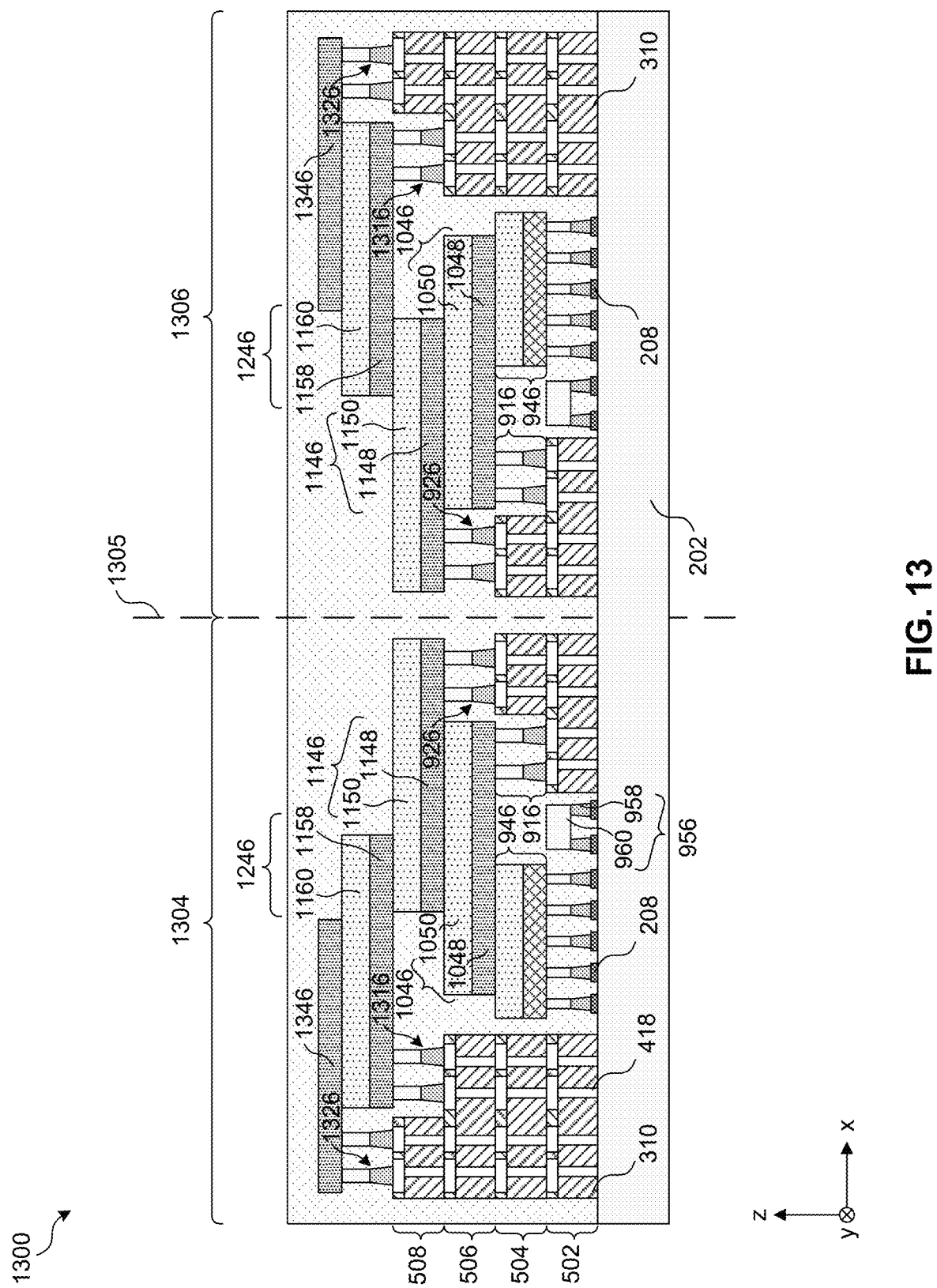
FIGS. 13 and 14 illustrate cross-sectional views of a stacked flip-chip package incorporating staircase interconnect structures formed on both ends of the stacked chips, in accordance with some embodiments of the present disclosure.
Figure 14:
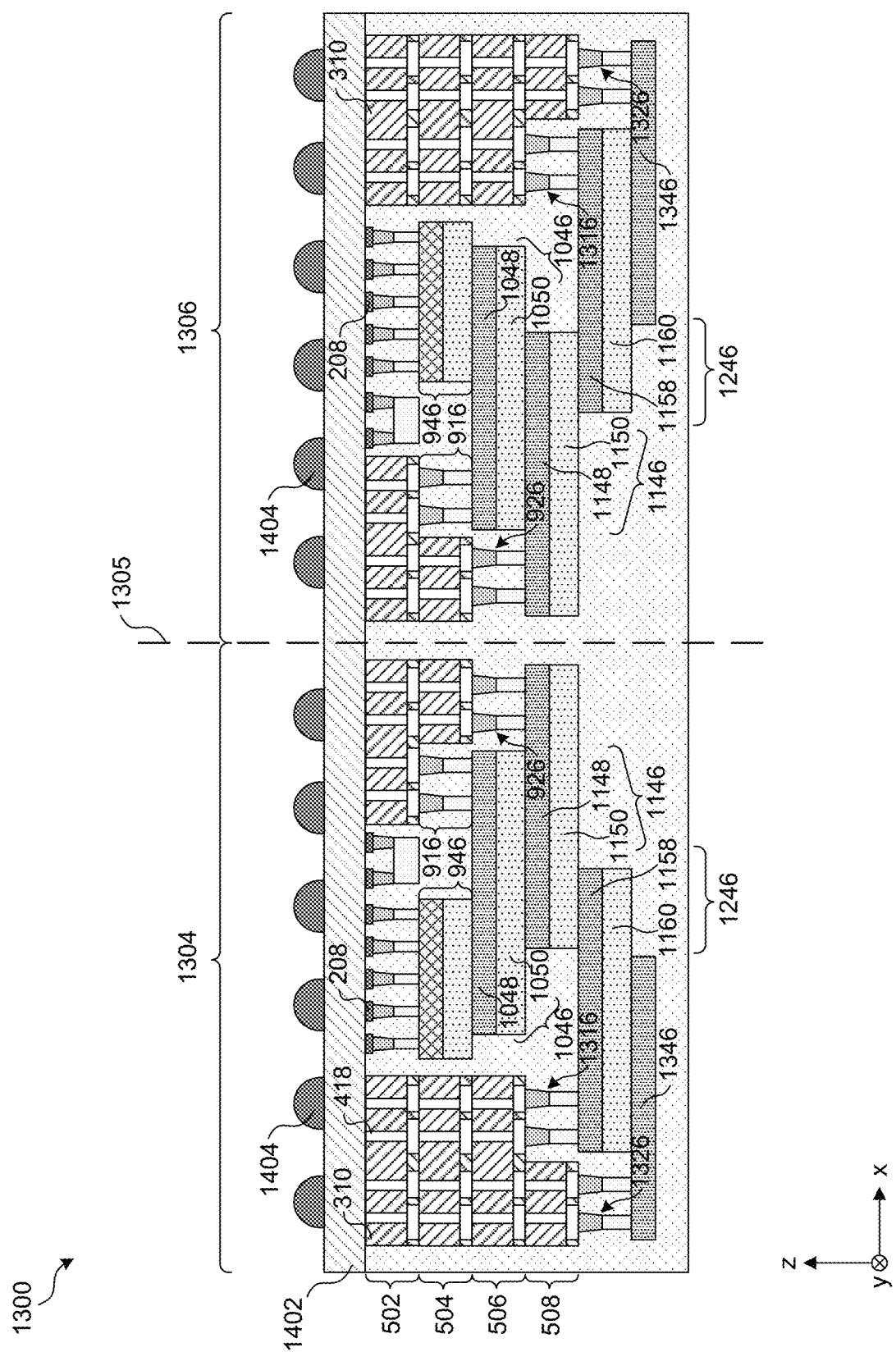

FIGS. 13 and 14 illustrate packaging structure 1300 incorporating staircase interconnect structures formed on both ends of stacked chips, according to some embodiments. Like reference numerals in FIGS. 2-14 generally indicate identical, functionally similar, and/or structurally similar elements.

FIG. 13 illustrate packaging structure 1300 prior to the formation of RDL and metal bumps. Packaging structure 1300 includes first package 1304 and second package 1306. In some embodiments, first and second packages 1304 and 1306 can be mirror symmetrical, as shown in FIG. 13. Stacked chips including chips 946, 1046, 1146, and 1246 are similar to those of FIGS. 2-12 and are not described in detail herein for simplicity. In contrast to the staircase interconnect structures described in FIGS. 2-12, staircase interconnect structures illustrated in FIGS. 13 and 14 are connected to both ends of the stacked chips. For example, as shown in FIG. 13, pillar bumps 916 and 926 are connected to one end of chips 1046 and 1146 while pillar bumps 1316 and 1326 are connected to the opposing end of chips 1246 and 1346.

FIG. 14 illustrate packaging structure 1300 after the formation of RDL and metal bumps. As shown in FIG. 14, RDL 1402 can be disposed on the backside of packaging structure 1300 and metal bumps 1404 can be disposed on RDL 1402. RDL 1402 and metal bumps 1404 can be similar to RDL 1202 and metal bumps 1204, and are not described in detail herein for simplicity.

Additional processes can be performed after metal bumps are disposed in the packaging structures illustrated in FIGS. 12 and 14. For example, panel level testing can be performed through the metal bumps to determine packaging characteristics, such as fabrication yield, device performance, and more. Dicing processes can be used to separate adjacent packages. For example, packages 204 and 206 of FIG. 12 can be separated by dicing along package boundary 205. Packages 1304 and 1306 can be separated by dicing along package boundary 1305.

Figure 15:
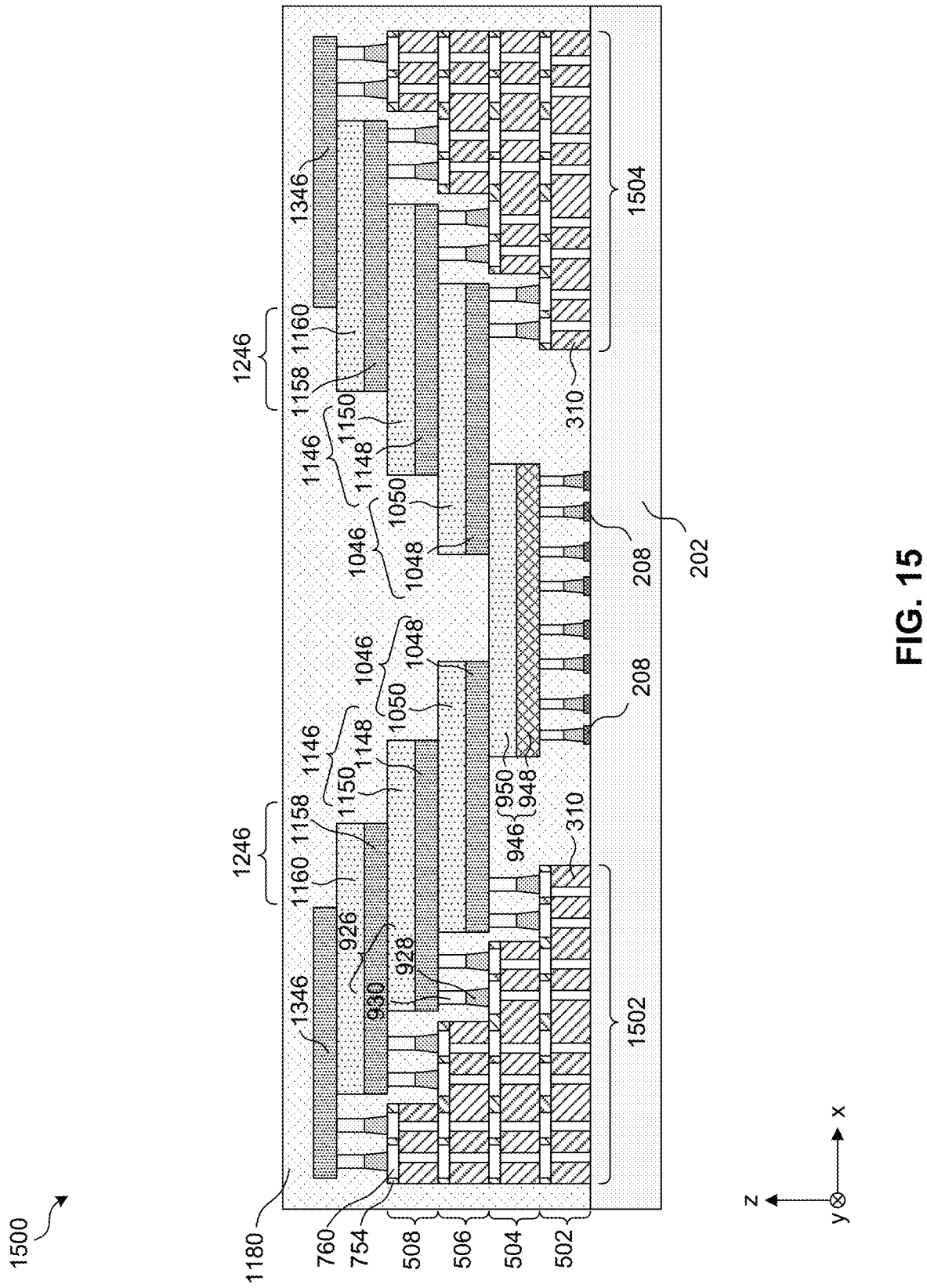
FIGS. 15 and 16 illustrate cross-sectional views of a stacked flip-chip package incorporating contact pads formed between staircase interconnect structures, in accordance with some embodiments of the present disclosure.
Figure 16:
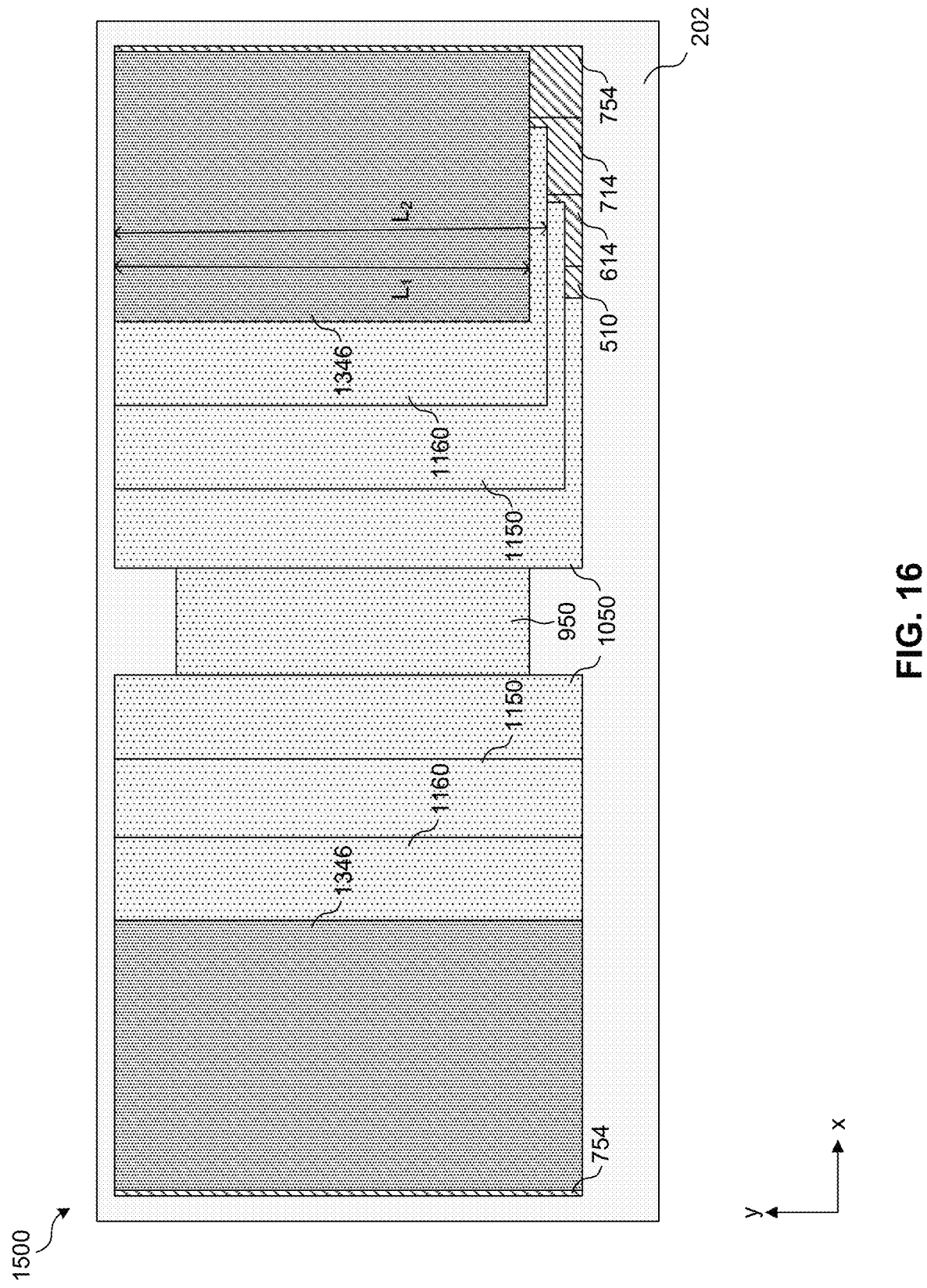

FIGS. 15 and 16 illustrate packaging structure 1500 prior to the formation of RDL and metal bumps, according to some embodiments. FIGS. 15 and 16 are cross-sectional and plan views of packaging structure 1500, respectively. Contact pads 208 are formed on a central region of substrate and between staircase layers 1502 and 1504. Similar to staircase layers illustrated in FIGS. 6-14, staircase layers 1502 and 1504 and can have steps formed in the x direction. In addition, staircase layers 1504 can also have steps formed in the y direction by suitable methods, such as stacking chips with incrementally decreasing lengths in they direction, as shown in FIG. 16. For example, chip 1346 having length $L_1$ can be formed on chip 1160 having a shorter length $L_2$. In some embodiments, mounting chips having similar lengths can also form steps in the y direction by mounting the subsequent chip with an incremental offset. RDL and metal bumps similar to those described in FIGS. 12 and 14 can be formed on packaging structure 1500 and are not discussed in detail herein for simplicity.

The present disclosure describes stacked staircase interconnect structures for memory chips in fan-out packaging. Stacked staircase interconnect structures can provide electrical connections to each chip of the stacked chips through pillar bumps formed on each level of the stacked staircase interconnect structure, which in turn increases the number of I/O connection points.

In some embodiments, a semiconductor package includes a redistribution layer (RDL) and metal bumps formed on a first surface of the RDL. The semiconductor package also includes a staircase interconnect structure formed on a second surface of the RDL. The staircase interconnect structure includes staircase layers and each staircase layer is offset from an adjacent staircase layer. The semiconductor package further includes integrated circuit (IC) chips electrically connected to the staircase interconnect structure.

In some embodiments, a semiconductor package includes a redistribution layer (RDL) and contact pads in contact with the RDL. The semiconductor package also includes a first plurality of pillar bumps in contact with the plurality of contact pads. The semiconductor package further includes a staircase interconnect structure in contact with the RDL. The staircase interconnect structure includes a first staircase layer having a first plurality of interconnects in contact with the RDL and a second staircase layer adjacent to the first staircase layer. The second staircase layer includes a second plurality of interconnects that contacts the first plurality of interconnects. The staircase interconnect structure further includes a third staircase layer adjacent to the second staircase layer and having a third plurality of interconnects. The semiconductor package also includes a first integrated circuit (IC) chip that contacts the first plurality of pillar bumps and a second plurality of pillar bumps that contacts the first staircase layer. The semiconductor package also includes a second IC chip in contact with the first IC chip and the second plurality of pillar bumps.

In some embodiments, a method for forming a semiconductor package includes forming a first staircase layer on a carrier substrate. Forming the first staircase layer includes disposing a first dielectric layer over the carrier substrate and forming a first plurality of interconnects in the first dielectric layer. The method also include disposing a blocking layer on the first staircase layer. The blocking layer contacts top surfaces of at least one interconnect of the first plurality of interconnects. The method further includes forming a second staircase layer on the first staircase layer. The second staircase layer contacts the blocking layer. The method also includes removing the blocking layer and exposing the top surfaces of the at least one interconnect. The method further includes forming pillar bumps on the exposed top surfaces of the at least one interconnect. The method also includes mounting an integrated circuit (IC) chip on the pillar bumps.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A semiconductor package, comprising:
   a redistribution layer (RDL) comprising a first surface in contact with a plurality of input/output (I/O) contacts and a second surface opposite to the first surface;
   a staircase interconnect structure formed on the second surface of the RDL and electrically connected with the RDL, wherein:
   the staircase interconnect structure comprises a plurality of staircase layers, wherein the plurality of staircase layers comprises a first staircase layer, a second staircase layer stacked on a top surface of the first staircase layer, and a third staircase layer stacked on a top surface of the second staircase layer;
   wherein the second staircase layer covers a portion of the top surface of the first staircase layer such that a remaining portion of the top surface of the first staircase layer is exposed; and
   wherein the third staircase layer covers a portion of the top surface of the second staircase layer such that a remaining portion of the top surface of the second staircase layer is exposed;
   a plurality of integrated circuit (IC) chips electrically connected to the RDL via the staircase interconnect structure, wherein a first IC chip of the plurality of IC chips is electrically connected to the RDL through the remaining portion of the top surface of the first staircase layer; and
   one or more pillar bumps, wherein each of the one or more pillar bumps comprises:
   two or more pillar bases; and
   a pillar body connected to the two or more pillar bases and to terminals of the plurality of IC chips, wherein the first IC chip is electrically connected to the first staircase layer through the one or more pillar bumps to electrically connected to the RDL, wherein the one or more pillar bumps are disposed at a same horizontal level as the second staircase layer, and wherein the first IC chip is disposed at a same horizontal level as the third staircase layer.

2. The semiconductor package of claim 1, wherein:
   a width of the second staircase layer is less than a width of the first staircase layer; and
   a width of third staircase layer is less than the width of the second staircase layer.

3. The semiconductor package of claim 1, wherein the plurality of IC chips further includes a second IC chip electrically connected to the RDL through the remaining portion of the top surface of the second staircase layer.

4. The semiconductor package of claim 3, wherein the second IC chip is offset from the first IC chip such that one or more terminals of the second IC chip are directly above the remaining portion of the top surface of the second staircase layer.

5. The semiconductor package of claim 3, wherein the plurality of IC chips further comprises a third IC chip flip-mounted on one or more pillar bumps.

6. The semiconductor package of claim 5, wherein the one or more pillar bumps and the first IC chip are disposed at a same horizontal level as the third staircase layer.

7. The semiconductor package of claim 5, wherein the third IC chip is electrically connected to the exposed part of the top surface of the second staircase layer through the one or more pillar bumps.

8. The semiconductor package of claim 2, wherein the first and second IC chips comprise NAND flash memory chips.

9. The semiconductor package of claim 1, further comprising:
   a plurality of contact pads disposed on the second surface of the RDL;
   a second IC chip flip-mounted on the contact pads.

10. The semiconductor package of claim 9, wherein the first IC chip is offset from the second IC chip such that one or more terminals of the first IC chip are directly over the remaining portion of the top surface of the first staircase layer.

11. The semiconductor package of claim 1, wherein the plurality of I/O contacts comprises a plurality of metal bumps.

12. The semiconductor package of claim 1, wherein the staircase interconnect structure comprises a first staircase interconnect structure and a second staircase interconnect structure, and the first staircase interconnect structure having a same extending direction with the second staircase interconnect structure.

13. The semiconductor package of claim 1, wherein the staircase interconnect structure comprises a first staircase interconnect structure and a second staircase interconnect structure, and the first staircase interconnect structure having an opposite extending direction with the second staircase interconnect structure.

14. The semiconductor package of claim 1, wherein the staircase interconnect structure comprises a first staircase interconnect structure and a second staircase interconnect structure, the first staircase interconnect structure having a opposite extending direction with the second staircase interconnect structure, the first staircase structure having a different height with the second staircase interconnect structure.

* * * * *

UNITED STATES PATENT AND TRADEMARK OFFICE
CERTIFICATE OF CORRECTION

| | |
|---|---|
| PATENT NO. | : 12,166,012 B2 |
| APPLICATION NO. | : 17/243687 |
| DATED | : December 10, 2024 |
| INVENTOR(S) | : Zeng et al. |

Page 1 of 1

It is certified that error appears in the above-identified patent and that said Letters Patent is hereby corrected as shown below:

In the Claims

In Column 14, Claim 1, Line 29, delete "to electrically" and insert --electrically--.

In Column 14, Claim 9, Line 64, delete ";" and insert --; and--.

In Column 15, Claim 12, Line 10, delete "and".

In Column 15, Claim 13, Line 16, delete "and".

In Column 15, Claim 14, Line 22, delete "a" and insert --an--.

In Column 15, Claim 14, Line 24, delete "structure, the" and insert --structure, and the--.

Signed and Sealed this
Fourteenth Day of January, 2025

Derrick Brent
*Acting Director of the United States Patent and Trademark Office*